United States Patent
Lee et al.

(10) Patent No.: US 7,911,289 B2
(45) Date of Patent: Mar. 22, 2011

(54) FILTER WITH MAGNETIC LAYER AND MANUFACTURING METHOD THEREOF

(75) Inventors: Cheng-Hong Lee, Taoyuan Hsien (TW); Yu-Lin Hsueh, Taoyuan Hsien (TW); Yi-Hong Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 275 days.

(21) Appl. No.: 12/142,327

(22) Filed: Jun. 19, 2008

(65) Prior Publication Data
US 2009/0128248 A1    May 21, 2009

(30) Foreign Application Priority Data
Nov. 16, 2007  (TW) ................................. 96143387 A

(51) Int. Cl.
*H04B 3/28* (2006.01)
*H01P 1/20* (2006.01)

(52) U.S. Cl. .......................................... 333/12; 333/202

(58) Field of Classification Search ................ 333/12, 333/202; 336/84 M, 200
See application file for complete search history.

(56) References Cited

U.S. PATENT DOCUMENTS 3,611,196 A * 10/1971 Tolksdorf et al. ............. 333/1.1
6,140,902 A * 10/2000 Yamasawa et al. ............. 336/83
* cited by examiner

*Primary Examiner* — Robert Pascal
*Assistant Examiner* — Kimberly E Glenn
(74) *Attorney, Agent, or Firm* — Muncy, Geissler, Olds & Lowe, PLLC

(57) ABSTRACT

A filter includes a first magnetic layer, a second magnetic layer, an insulating layer, a plurality of coils, a first non-magnetic layer and a second non-magnetic layer. The insulating layer is disposed between the first magnetic layer and the second magnetic layer, and the coils are disposed in the insulating layer. The first non-magnetic layer is disposed on one side of the first magnetic layer, which is far away from the insulating layer, and the second non-magnetic layer is disposed on one side of the second magnetic layer, which is far away from the insulating layer.

17 Claims, 14 Drawing Sheets

FILTER WITH MAGNETIC LAYER AND MANUFACTURING METHOD THEREOF

CROSS REFERENCE TO RELATED APPLICATIONS

This Non-provisional application claims priority under 35 U.S.C. §119(a) on Patent Application No(s). 096143387 filed in Taiwan, Republic of China on Nov. 16, 2007, the entire contents of which are hereby incorporated by reference.

BACKGROUND OF THE INVENTION

1. Field of Invention

The invention relates to a filter and a manufacturing method thereof. More particularly, the invention relates to a common mode filter and a manufacturing method thereof.

2. Related Art

Recently, applications of power electronic circuits are widely spread and this kind of circuits usually operate in a high-frequency switching state, so electro magnetic interference (EMI) is easily occurred. The high-frequency noises may be conducted through the electromagnetic radiation or power lines to interfere with normal works of other electronic apparatuses. The conductive EMI can be a differential mode (DM) noise or a common mode (CM) noise according to different noise current transferring paths.

In order to eliminate the EMI effectively, a filter for eliminating a kind of the noises is usually equipped in the electronic apparatus. For example, when the common mode noises are to be eliminated, a common mode filter for eliminating the common mode noises is equipped in the electronic apparatus.

The common mode filter suppresses the common mode noises and prevents the signals transmitted in the circuit from being distorted. The conventional common mode filter has a magnetic layer serving as a substrate having a thickness of about several hundreds of microns (about 300 microns).

However, the magnetic layer cannot be easily formed and has the thickness of several hundreds of microns (about 300 microns). Therefore, when the conventional common mode filter operates at the high-frequency band, a lot of transmission loss may occur.

SUMMARY OF THE INVENTION

In view of the foregoing, the invention is to provide a filter with a reduced transmission loss and a manufacturing method thereof.

To achieve the above, the invention discloses a filter including a first magnetic layer, a second magnetic layer, an insulating layer, a plurality of coils, a first non-magnetic layer and a second non-magnetic layer. The insulating layer is disposed between the first magnetic layer and the second magnetic layer. The coils are disposed in the insulating layer. The first non-magnetic layer is disposed on one side of the first magnetic layer, which is opposite to the insulating layer. The second non-magnetic layer is disposed on one side of the second magnetic layer, which is opposite to the insulating layer.

In addition, the invention also discloses a manufacturing method of a filter. The method includes the following steps of forming a first magnetic layer on a first non-magnetic layer, forming an insulating layer on the first magnetic layer, forming a plurality of coils in the insulating layer, forming a second magnetic layer on a second non-magnetic layer, and combining the insulating layer with the second magnetic layer.

As mentioned above, the thickness of each of the first magnetic layer and the second magnetic layer ranges from sub-microns to several tens of microns, and the non-magnetic substrate made of, for example, aluminum oxide is adopted in the present invention. Compared with the prior art, when the filter of the present invention operates at a high-frequency band, it has lower transmission loss.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 1:
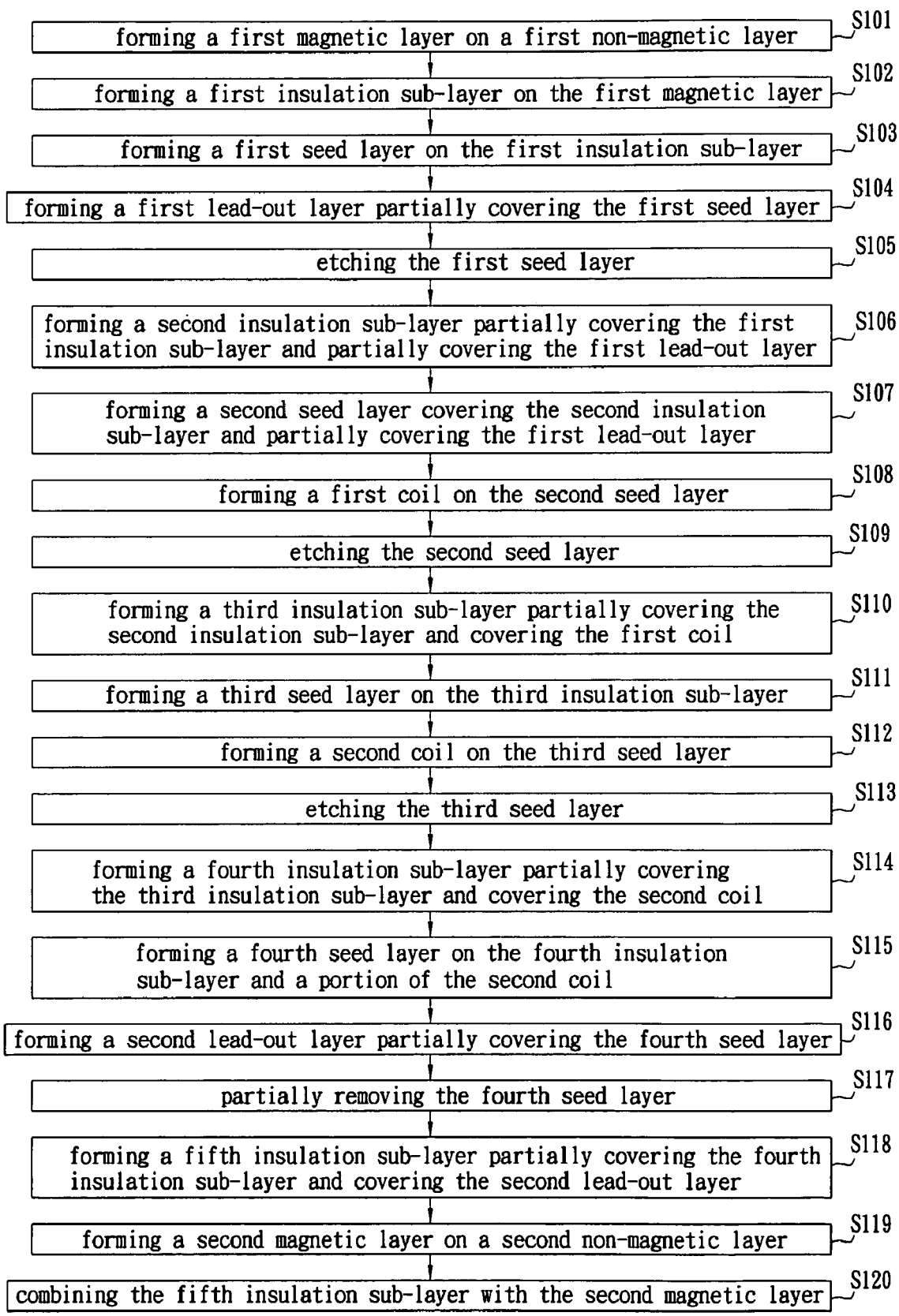
FIG. 1 is a flow diagram showing a manufacturing method of a common mode filter according to a first embodiment of the present invention.

Referring to FIG. 1, a manufacturing method of a common mode filter 1 according to a first embodiment of the present invention includes steps S101 to S120. Illustrations will be made with reference to FIG. 1 in view of FIGS. 2A to 2P.

Figure 2A:
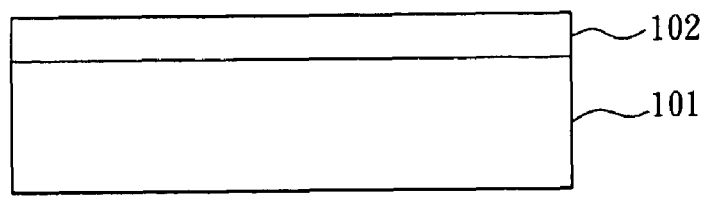
FIGS. 2A to 2P are schematic sectional views showing various partial structures of the common mode filter corresponding to the flow chart of FIG. 1.

As shown in FIG. 2A, a first magnetic layer 102 is formed on a first non-magnetic layer 101 in the step S101. The first non-magnetic layer 101 can be a non-magnetic substrate made of, for example, aluminum oxide. The material of the first magnetic layer 102 includes nickel-zinc ferrite, barium ferrite or any other ferrite suitable for high-frequency operation.

In practice, the first magnetic layer 102 is formed on the first non-magnetic layer 101 by coating, printing or spin coating process.

When the first magnetic layer 102 is formed on the first non-magnetic layer 101 by coating process, the step S101 includes deposing a first magnetic sub-layer (not shown) on the first non-magnetic layer 101 and forming a second magnetic sub-layer (not shown) on the first magnetic sub-layer. Herein, the material of the first magnetic sub-layer includes an anti-ferromagnetic (AFM) material, and the material of the second magnetic sub-layer includes a ferromagnetic (FM) material. Optionally, only a single magnetic sub-layer can be formed in the step S101, and the single magnetic sub-layer includes the AFM material or the FM material.

Figure 2B:
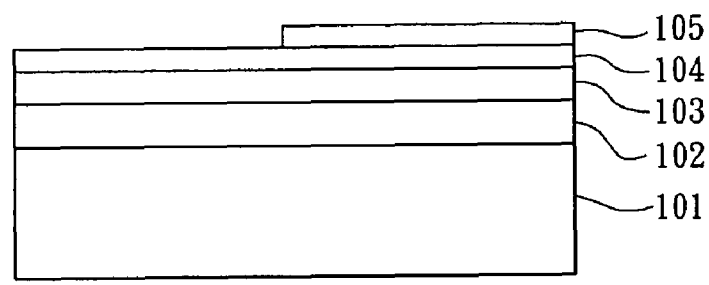

As shown in FIG. 2B, a first insulation sub-layer 103 is formed on the first magnetic layer 102 in the step S102. In the step S103, a first seed layer 104 is formed on the first insulation sub-layer 103. In the step S104, a first lead-out layer 105 partially covering the first seed layer 104 is formed.

Figure 2C:
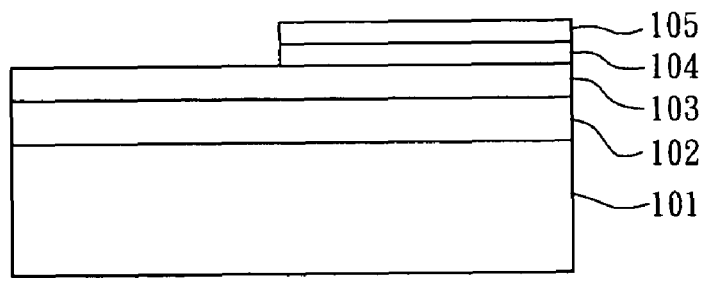

As shown in FIG. 2C and in the step S105, a portion of the first seed layer 104, which is not covered by the first lead-out layer 105, is removed so that the first insulation sub-layer 103 is partially exposed.

Figure 2D:
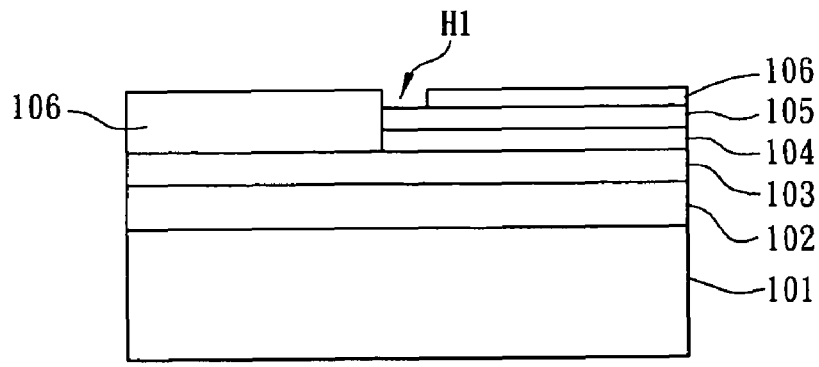

As shown in FIG. 2D, a second insulation sub-layer 106 partially covering the first insulation sub-layer 103 and partially covering the first lead-out layer 105 is formed in the step S106. The second insulation sub-layer 106 includes a first hole H1 so that the first lead-out layer 105 is exposed therein.

Figure 2E:
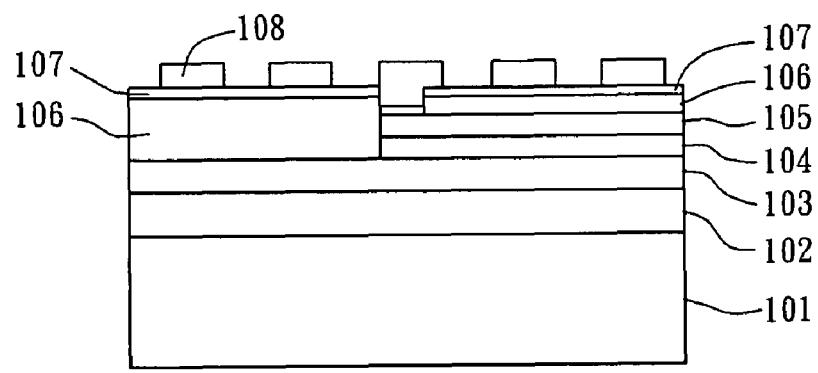
Figure 2F:
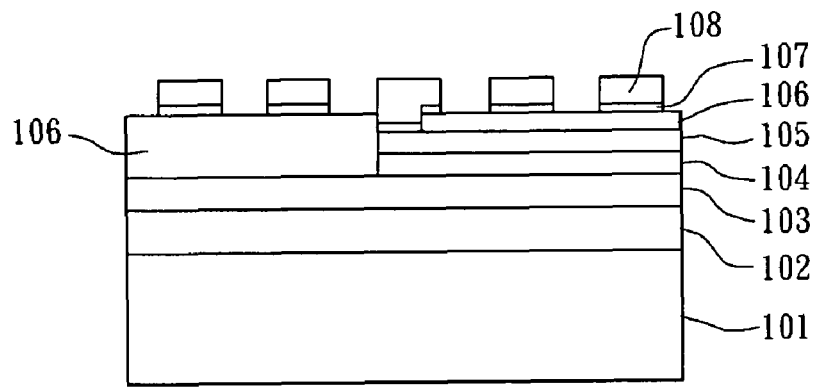

As shown in FIG. 2E, a second seed layer 107 covering the second insulation sub-layer 106, partially covering the first lead-out layer 105 and covering the first hole H1 is formed in the step S107. In the step S108, a first coil 108 is formed on the second seed layer 107 so that the hole H1 is filled by the first coil 108. In the step S109, the portion of the second seed layer 107 without covered by the first coil 108 is removed to expose the second insulation sub-layer 106, as shown in FIG. 2F.

Figure 2G:
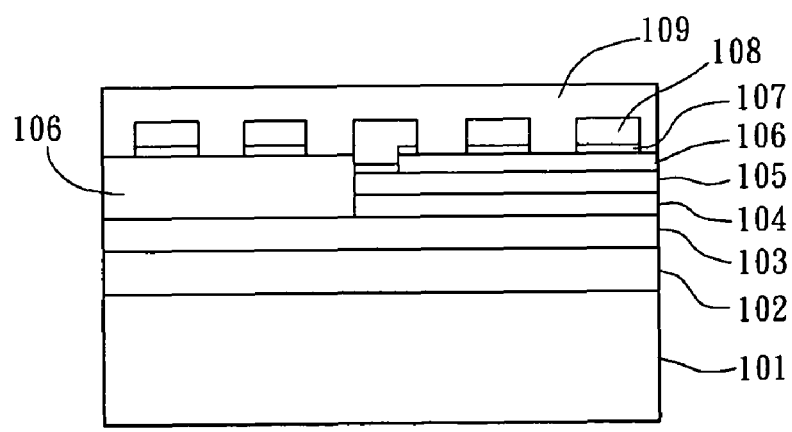
Figure 2H:
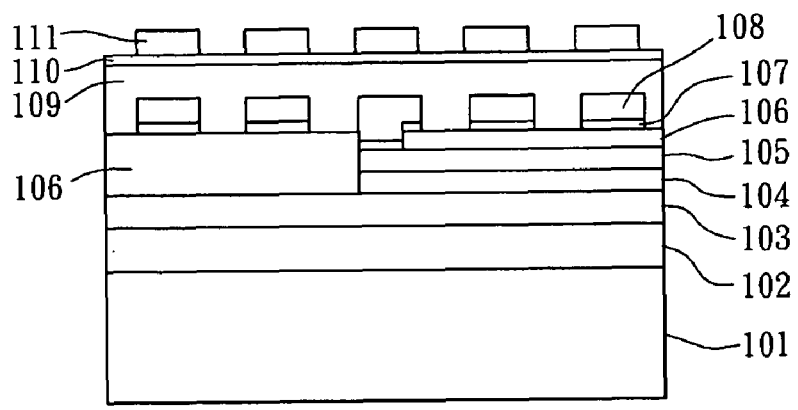

As shown in FIG. 2G, a third insulation sub-layer 109 covering the exposed second insulation sub-layer 106 and covering the first coil 108 is formed in the step S110. As shown in FIG. 2H, a third seed layer 110 is formed on the third insulation sub-layer 109 in the step S111, and a second coil 111 is formed on the third seed layer 110 in the step S112. The materials of the first coil and the second coil include copper or silver.

Figure 2I:
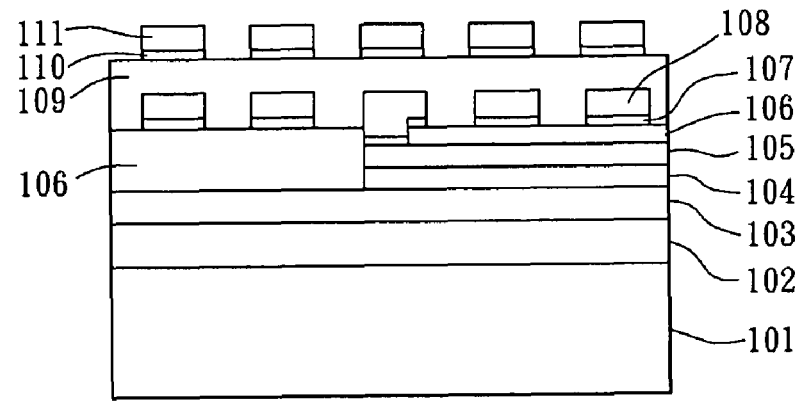
Figure 2J:
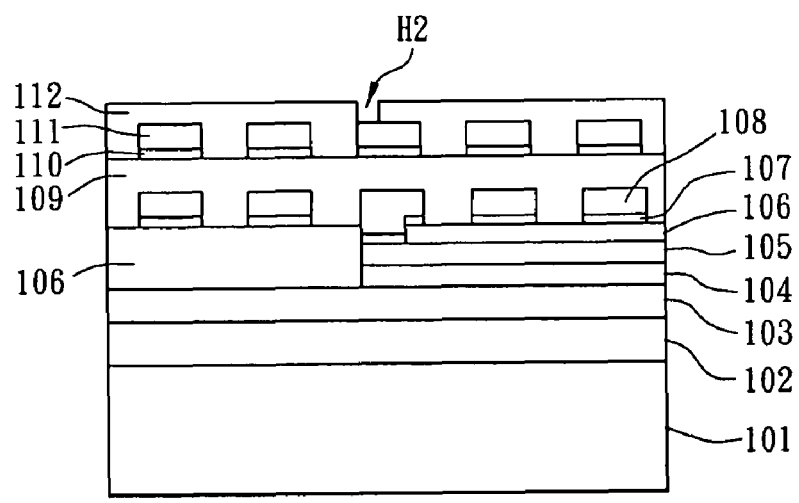

As shown in FIG. 2I, the portion of the third seed layer 110 without covered by the second coil 111 is removed in the step S113. As shown in FIG. 2J, a fourth insulation sub-layer 112 covering the exposed third insulation sub-layer 109 and covering the second coil 111 is formed in the step S114. The fourth insulation sub-layer 112 includes a second hole H2 so that a portion of the second coil 111 is exposed therein.

Figure 2K:
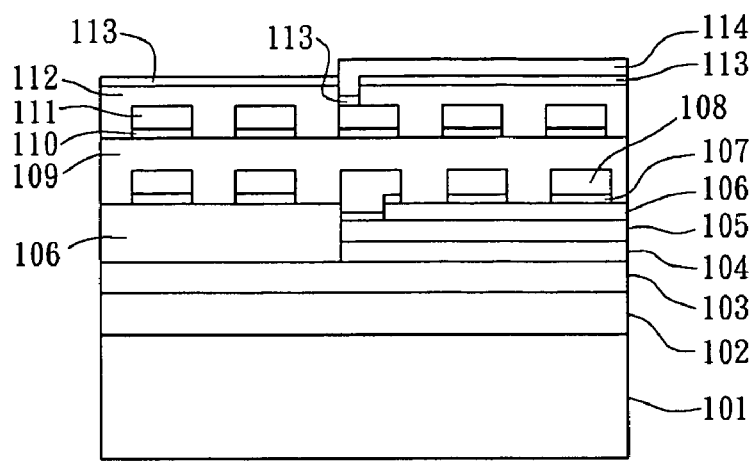

As shown in FIG. 2K, a fourth seed layer 113 is formed on the fourth insulation sub-layer 112 and the second coil 111 exposed in the second hole H2 in the step S115. In the step S116, a second lead-out layer 114 partially covering the fourth seed layer 113 and filling the second hole H2 is formed.

Figure 2L:
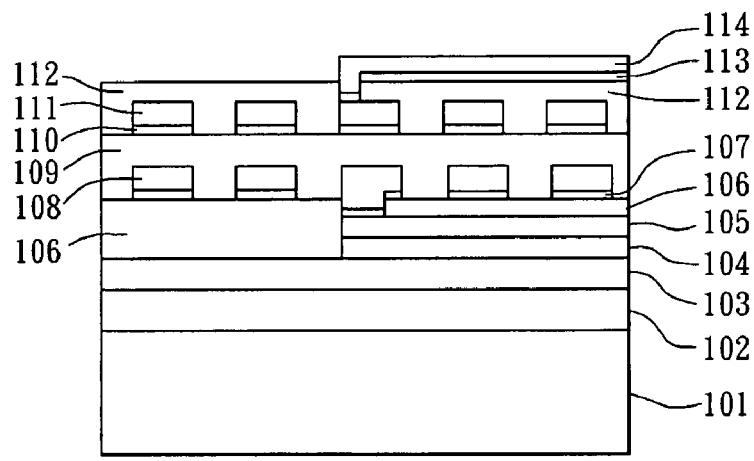
Figure 2M:
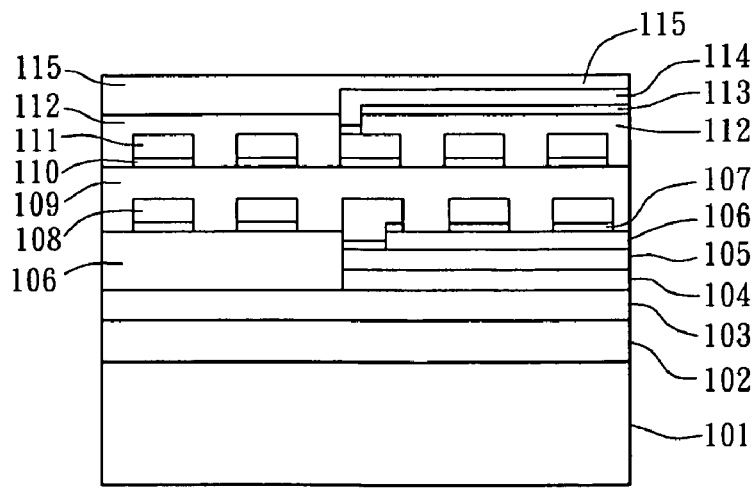

As shown in FIG. 2L, the fourth seed layer 113 uncovered by the second lead-out layer 114 is removed by, without limitation to, a lithography process or an etching process in the step S117. As shown in FIG. 2M, a fifth insulation sub-layer 115 partially covering the exposed fourth insulation sub-layer 112 and the second lead-out layer 114 is formed in the step S118.

Figure 2N:
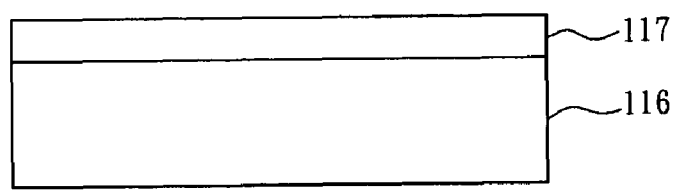
Figure 2O:
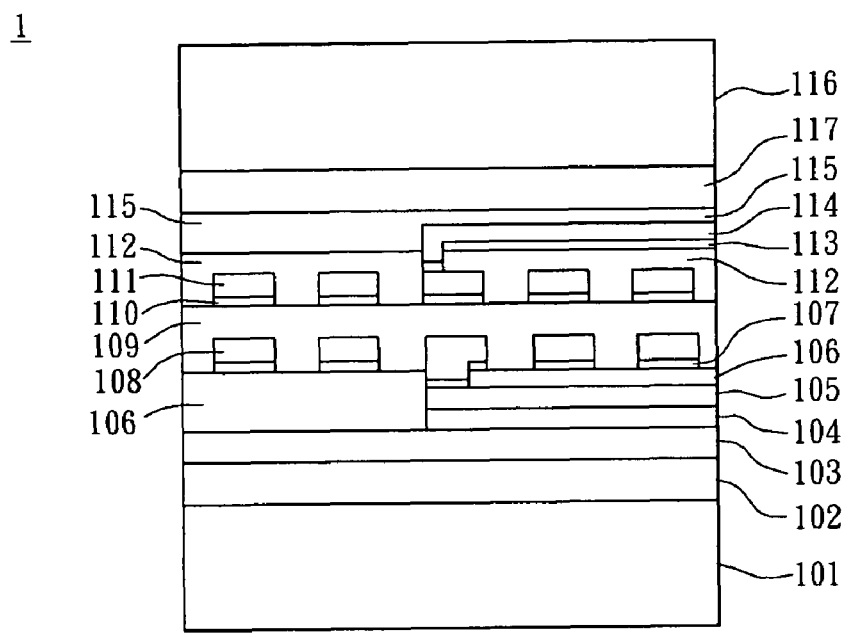
Figure 2P:
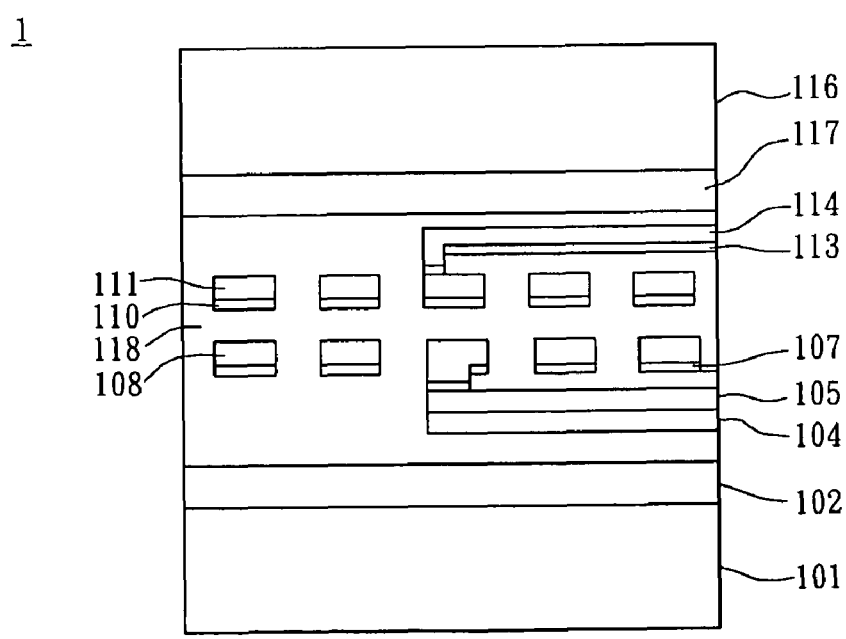

As shown in FIG. 2N, a second magnetic layer 117 is formed on a second non-magnetic layer 116 in the step S119. The second non-magnetic layer 116 can be a non-magnetic substrate, and the material thereof includes aluminum oxide. In the step S120, the fifth insulation sub-layer 115 is combined with the second magnetic layer 117 to form the common mode filter 1, as shown in FIG. 2O.

The first insulation sub-layer 103, the second insulation sub-layer 106, the third insulation sub-layer 109, the fourth insulation sub-layer 112 and the fifth insulation sub-layer 115 can be integrated as an insulating layer 118. The insulation sub-layers 103, 106, 109, 112 and 115 may have the same material or different materials. Herein, the insulation sub-layers 103, 106, 109, 112 and 115 have the same material, for example, to form the common mode filter 1 shown in FIG. 2P.

In this embodiment, the thickness of each of the first magnetic layer 102 and the second magnetic layer 117 ranges from about sub-microns to several tens of microns. Compared with the prior art, when the common mode filter 1 of this embodiment operates at the high-frequency band, it has lower transmission loss.

It is to be noted that the order of the above-mentioned steps is not particularly limited, and can be changed according to the requirement in the manufacturing processes.

Second Embodiment

Figure 3:
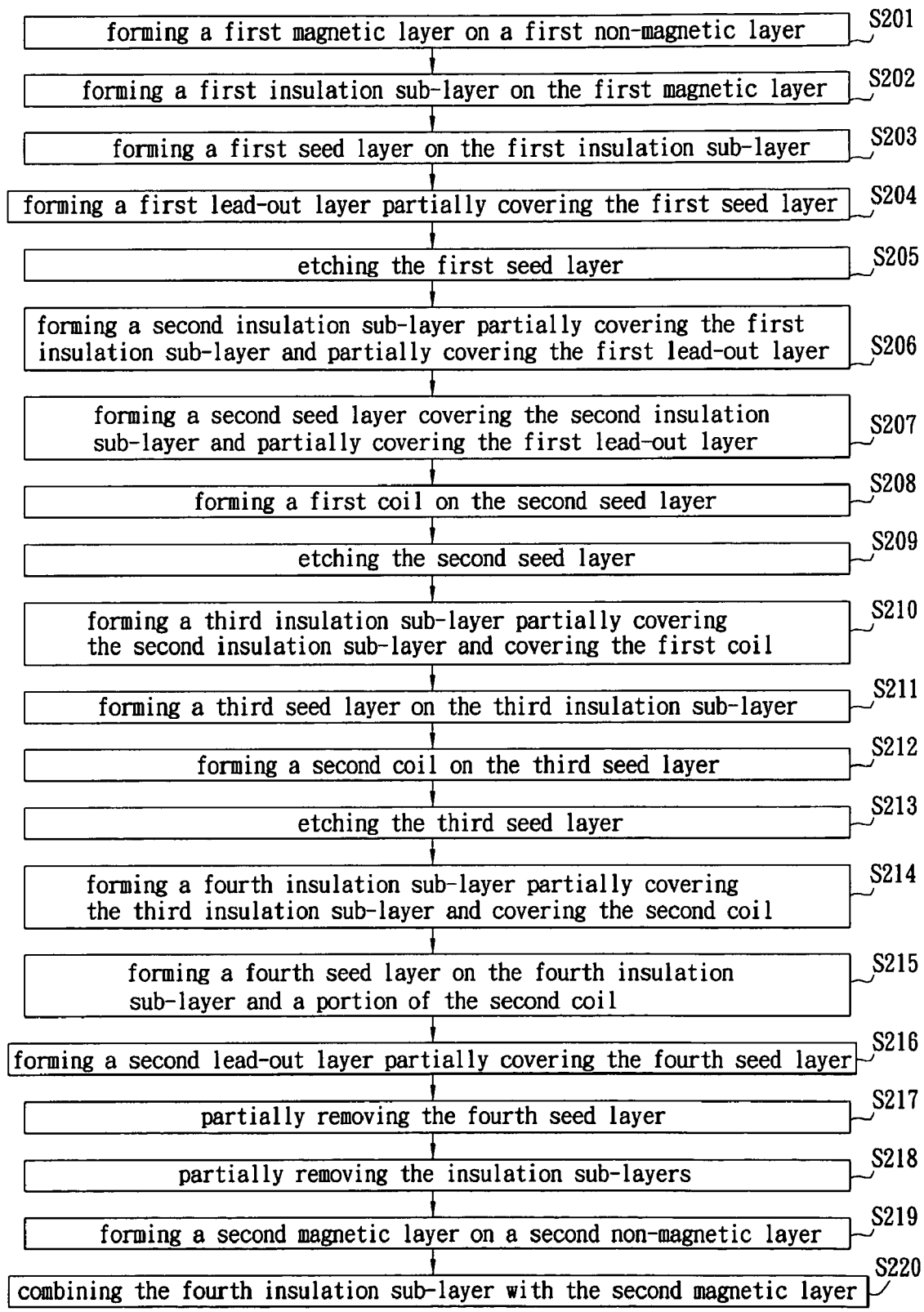
FIG. 3 is a flow diagram showing a manufacturing method of a common mode filter according to a second embodiment of the present invention.

Referring to FIG. 3, a manufacturing method of a common mode filter 2 according to a second embodiment of the present invention includes steps S201 to S220. Illustrations will be made with reference to FIG. 3 in conjunction with FIGS. 4A to 4S, wherein the processes in FIG. 4A to 4L are the same as those of the first embodiment in FIGS. 2A to 2L, so detailed descriptions thereof will be omitted.

Figure 4A:
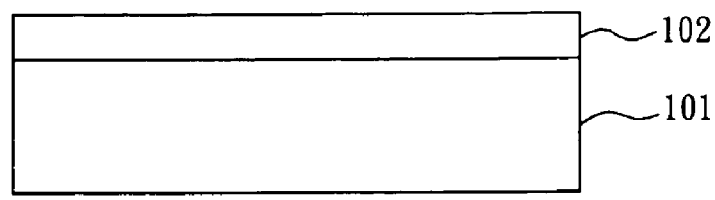
FIGS. 4A to 4S are schematic sectional views showing various partial structures of the common mode filter corresponding to the flow chart of FIG. 3.
Figure 4B:
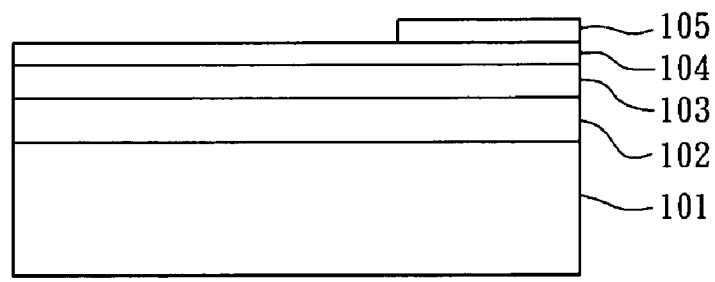
Figure 4C:
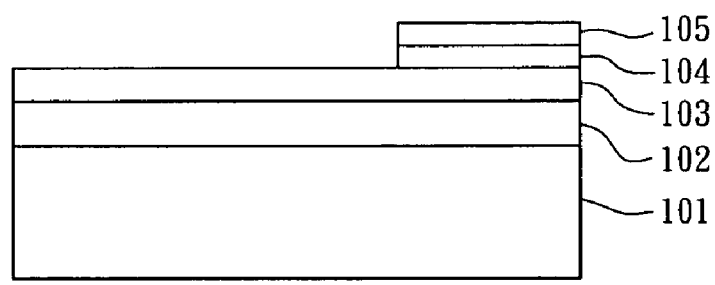
Figure 4D:
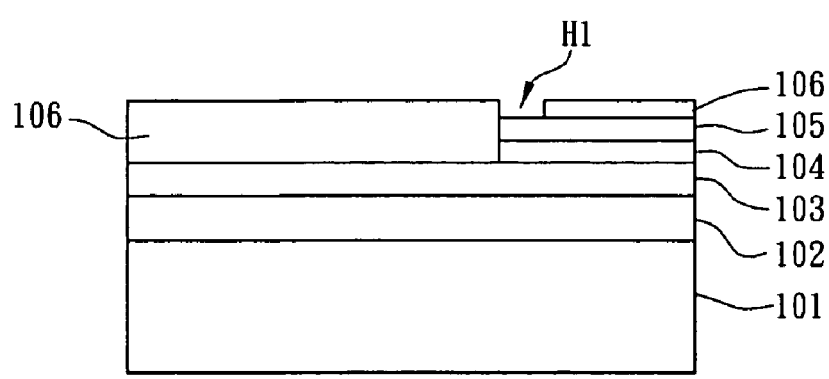
Figure 4E:
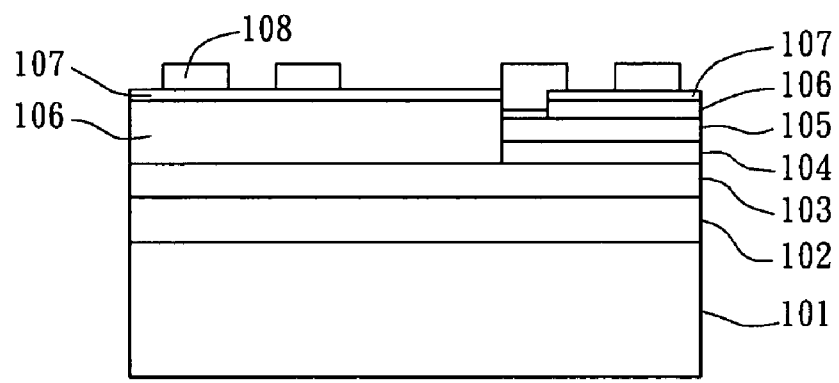
Figure 4F:
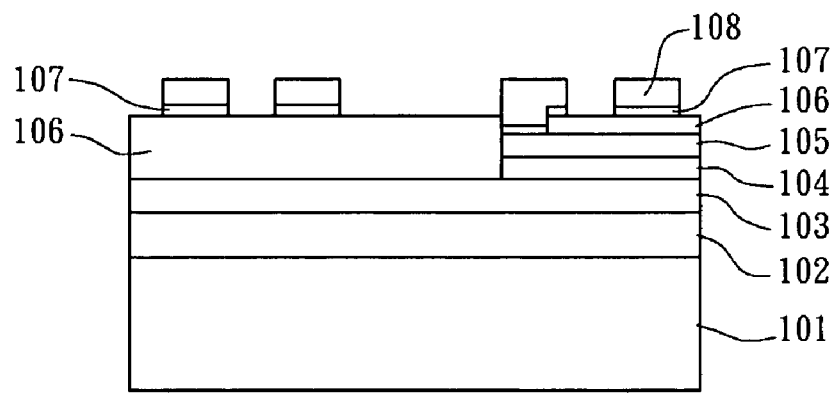
Figure 4G:
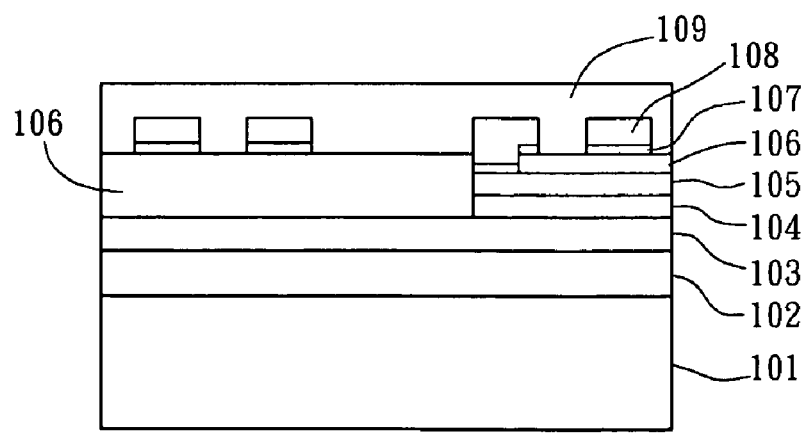
Figure 4H:
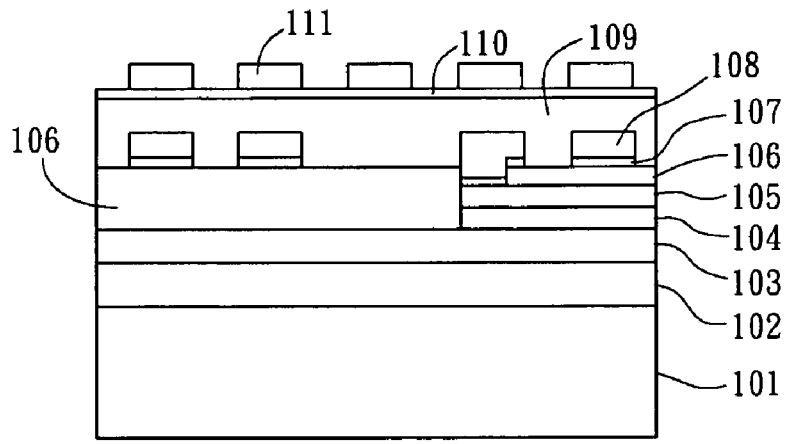
Figure 4I:
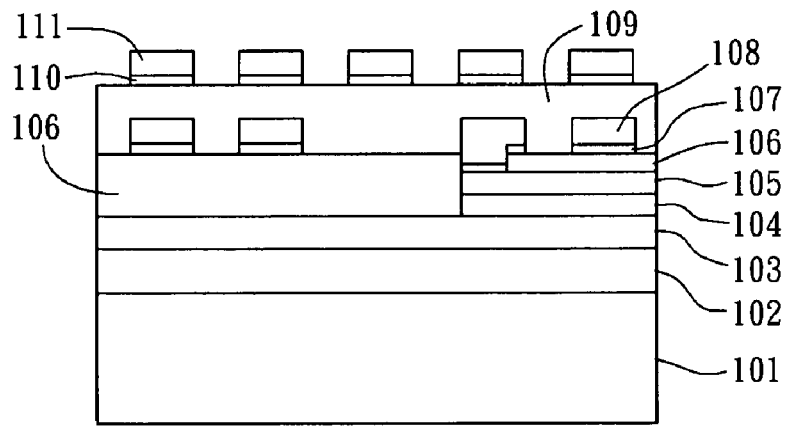
Figure 4J:
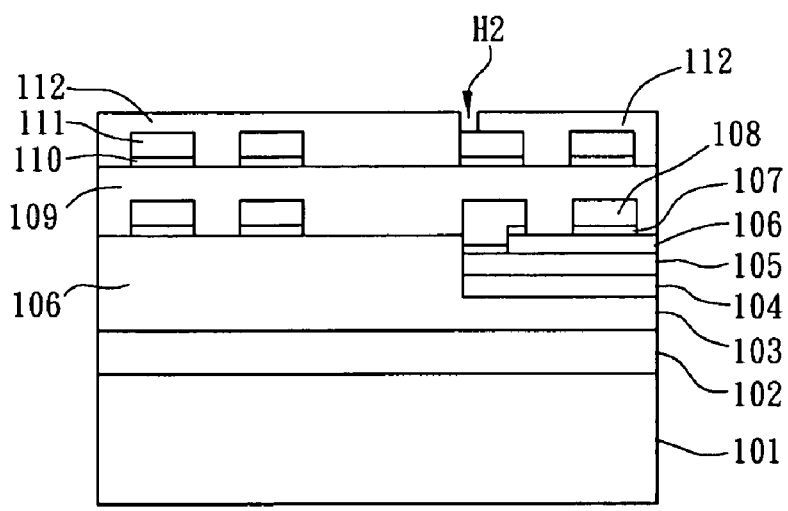
Figure 4K:
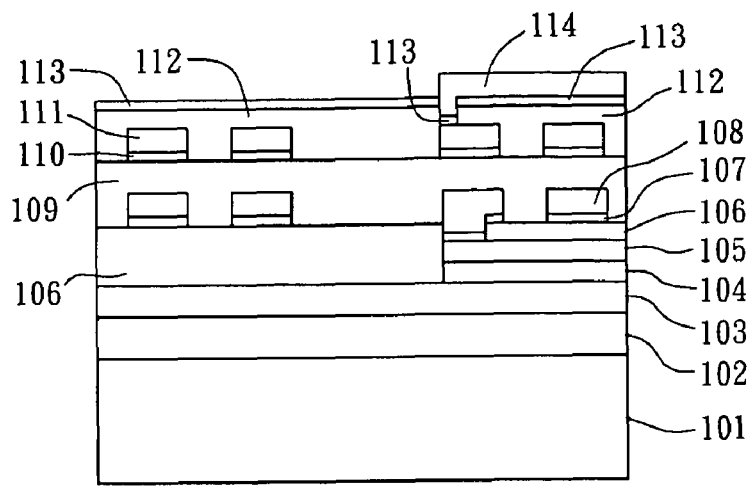
Figure 4L:
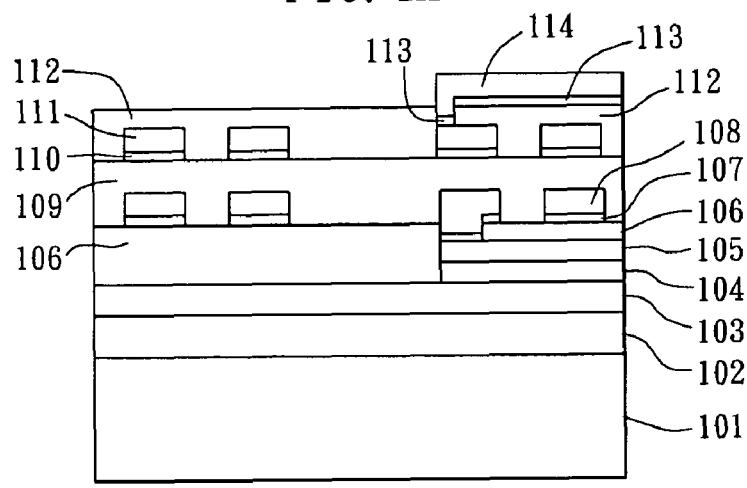
Figure 4M:
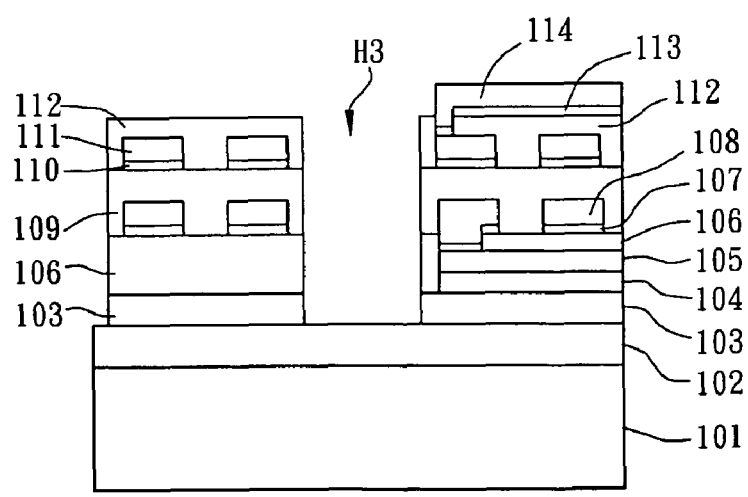

As shown in FIG. 4M, a portion of a fourth insulation sub-layer 112, a portion of a third insulation sub-layer 109, a portion of a second insulation sub-layer 106 and a portion of a first insulation sub-layer 103 are removed to form a hole H3 by, without limitation to, a lithography process or an etching process in the step S218.

Figure 4N:
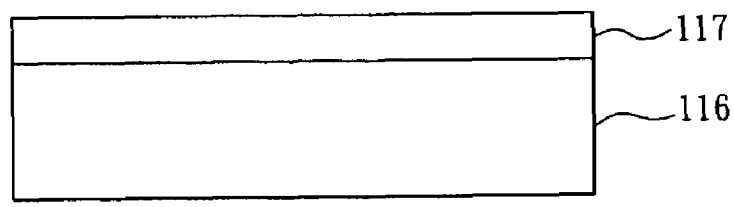
Figure 4O:
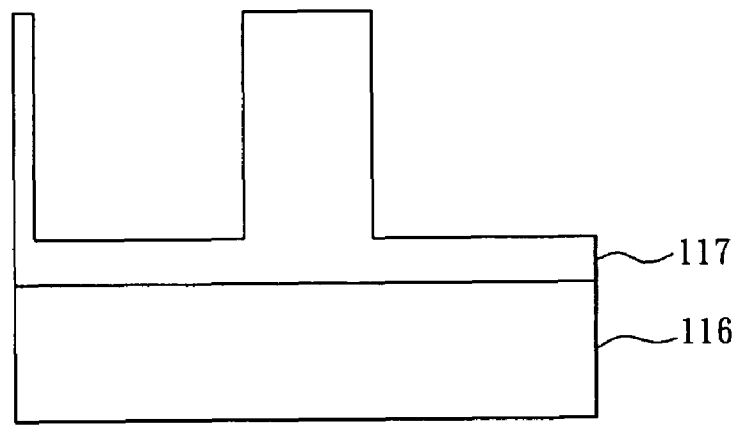

In the step S219, a second magnetic layer 117 is formed on a second non-magnetic layer 116, and can have various aspects, as shown in FIG. 4N or 4O. The second non-magnetic layer 116 can be a non-magnetic substrate, and the material thereof includes aluminum oxide.

Figure 4P:
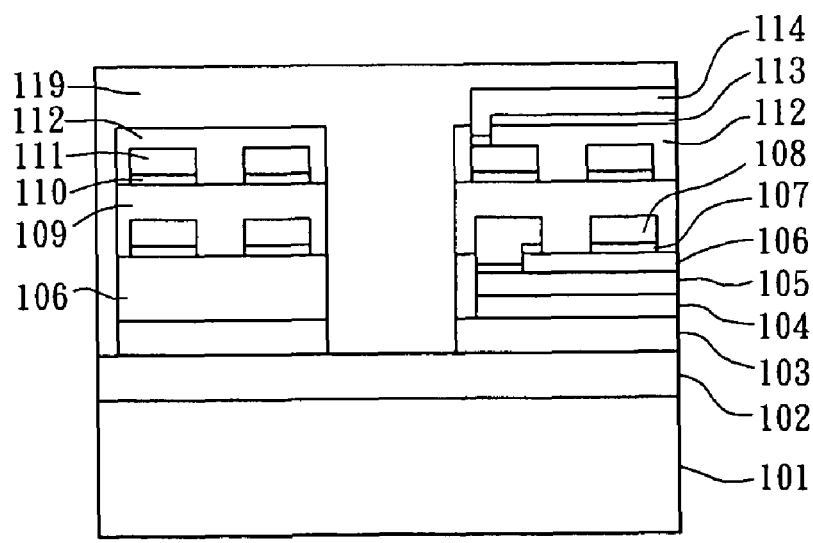
Figure 4Q:
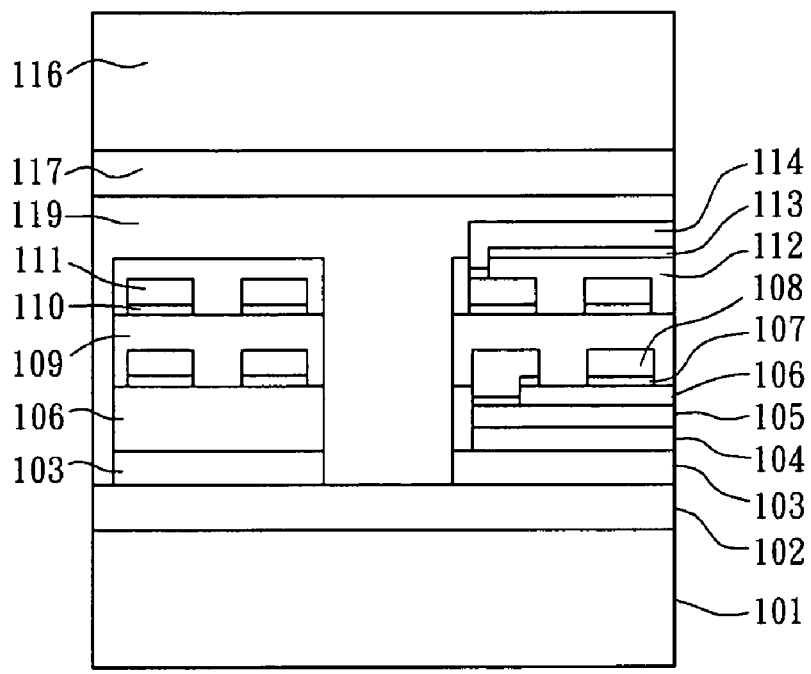

As shown in FIG. 4P, when the second non-magnetic layer 116 and the second magnetic layer 117 are shown in FIG. 4N, a magnetic material 119 is filled into the hole H3 to cover a second lead-out layer 114 and the portion of the fourth insulation sub-layer 112. In the step S220, the fourth insulation sub-layer 112 is combined with the second magnetic layer 117 to form the common mode filter 2, as shown in FIG. 4Q.

Figure 4R:
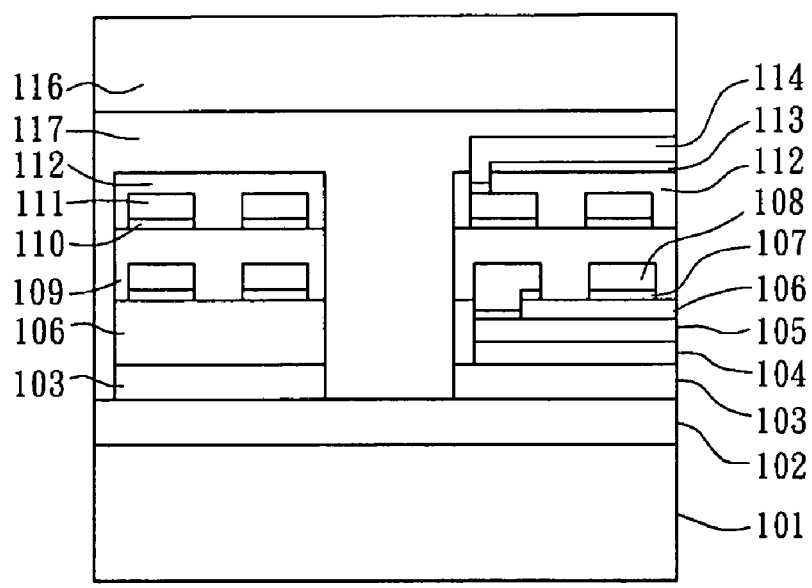
Figure 4S:
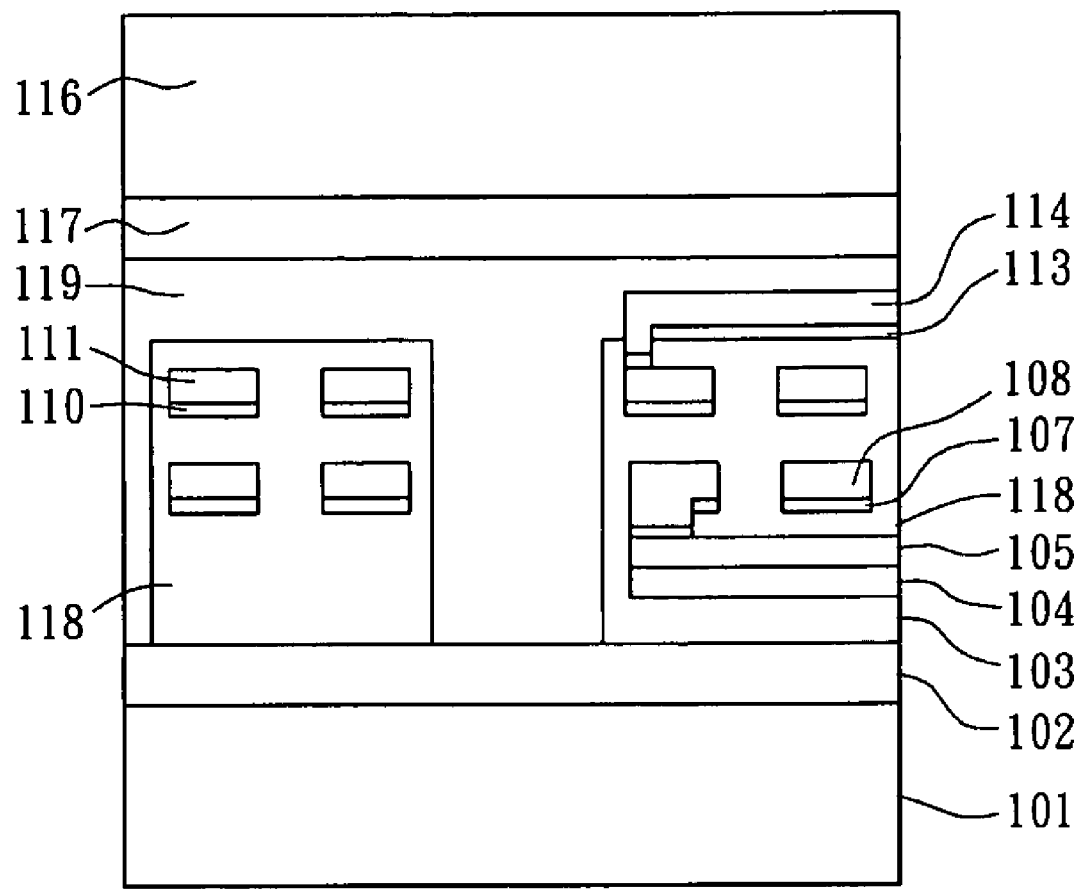

After the second non-magnetic layer 116 and the second magnetic layer 117 are formed as shown in FIG. 4O, the step S220 is also performed. In the step S220, the fourth insulation sub-layer 112 is combined with the second magnetic layer 117 to form the common mode filter 2, as shown in FIG. 4R.

The first insulation sub-layer 103, the second insulation sub-layer 106, the third insulation sub-layer 109 and the fourth insulation sub-layer 112 can be integrated as an insulating layer 118. The insulation sub-layers can have the same material or different materials. Herein, the first, second, third and fourth insulation sub-layers 103, 106, 109, 112 have the same material, for example, to form the common mode filter 2 shown in FIG. 4S.

The thickness of each of a first magnetic layer 102 and a second non-magnetic layer 117 ranges from about sub-microns to several tens of microns. Compared with the prior art, when the common mode filter 2 of this embodiment operates at the high-frequency band, it has lower transmission loss. In addition, the common mode filter 2 of the embodiment forms a magnetic closed loop through a magnetic material 119, the first magnetic layer 102 and the second magnetic layer 117, and thus has larger inductance and better filtering effect.

It is to be noted that the order of the above-mentioned steps is not particularly limited, and can be changed according to the requirement in the manufacturing processes.

In summary, the thickness of each of the first magnetic layer and the second magnetic layer ranges from sub-microns to several tens of microns, and the non-magnetic substrate made of, for example, aluminum oxide is adopted in the present invention. Compared with the prior art, when the filter of the present invention operates at a high-frequency band, it has lower transmission loss.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A filter comprising:
a first magnetic layer;
a second magnetic layer;
an insulating layer disposed between the first magnetic layer and the second magnetic layer;
a first coil and a second coil disposed in the insulating layer;
a first non-magnetic layer disposed on one side of the first magnetic layer, which is opposite to the insulating layer;
a second non-magnetic layer disposed on one side of the second magnetic layer, which is opposite to the insulating layer
a first seed layer disposed in the insulating layer;
a first lead-out layer disposed in the insulating layer and electrically connected to the first seed layer; and
a second seed layer disposed in the insulating layer and electrically connected to the first coil, wherein the first lead-out layer is electrically connected to a portion of the second seed layer.

2. The filter according to claim 1, wherein the first non-magnetic layer or the second non-magnetic layer comprises aluminum oxide.

3. The filter according to claim 1, wherein materials of the first magnetic layer and the second magnetic layer comprise a ferrite, a nickel-zinc ferrite or a barium ferrite.

4. The filter according to claim 1, wherein the first and second coils comprise copper or silver.

5. The filter according to claim 1, further comprising:
a third seed layer disposed in the insulating layer and electrically connected to the second coil;
a fourth seed layer disposed in the insulating layer and electrically connected to a portion of the second coil; and
a second lead-out layer disposed in the insulating layer and electrically connected to the fourth seed layer.

6. The filter according to claim 5, wherein the insulating layer comprises a hole penetrating through the insulating layer.

7. The filter according to claim 6, further comprising a magnetic material disposed in the hole so that the first magnetic layer is electrically connected to the second magnetic layer through the magnetic material.

8. A manufacturing method of a filter, comprising steps of:
forming a first magnetic layer on a first non-magnetic layer wherein the first magnetic layer is formed on the first non-magnetic layer by a coating process, a printing process or a spin coating process, wherein the coating process comprises forming a first magnetic sub-layer on the first non-magnetic layer;
forming an insulating layer on the first magnetic layer;
forming a plurality of coils in the insulating layer;
forming a second magnetic layer on a second non-magnetic layer; and
combining the insulating layer with the second magnetic layer.

9. The method according to claim 8, wherein the coating process comprises steps of: forming the first magnetic sub-layer on the first non-magnetic layer; and forming a second magnetic sub-layer on the first magnetic sub-layer.

10. The method according to claim 9, wherein a material of the first magnetic sub-layer is an anti-ferromagnetic material, and a material of the second magnetic sub-layer is a ferromagnetic material.

11. The method according to claim 8, wherein the step of forming the insulating layer comprises:
forming a first insulation sub-layer on the first magnetic layer;
forming a first seed layer on the first insulation sub-layer;
forming a first lead-out layer for partially covering the first seed layer; and
etching the first seed layer with the first lead-out layer serving as an etch-stop layer to partially expose the first insulation sub-layer.

12. The method according to claim 11, further comprising steps of:
forming a second insulation sub-layer for partially covering the first insulation sub-layer and partially covering the first lead-out layer, wherein the second insulation sub-layer has a first hollow portion on the first lead-out layer; and
forming a second seed layer for covering the second insulation sub-layer and partially covering the first lead-out layer.

13. The method according to claim 12, wherein the step of forming a plurality of coils in the insulating layer comprises step of:
forming a first coil of the plurality of coils on the second seed layer;
wherein the method further comprises steps of:
etching the second seed layer with the first coil serving as an etch-stop layer;
forming a third insulation sub-layer for partially covering the second insulation sub-layer and covering the first coil;
forming a third seed layer on the third insulation sub-layer; and
wherein the step of forming a plurality of coils in the insulating layer further comprises step of:
forming a second coil of the plurality of coils on the third seed layer.

14. The method according to claim 13, further comprising steps of:
etching the third seed layer with the second coil serving as an etch-stop layer; and
forming a fourth insulation sub-layer for partially covering the third insulation sub-layer and covering the second coil, wherein the fourth insulation sub-layer has a second hollow portion on a portion of the second coil.

15. The method according to claim 14, further comprising steps of:
forming a fourth seed layer on the fourth insulation sub-layer and the portion of the second coil;
forming a second lead-out layer for partially covering the fourth seed layer; and
partially removing the fourth seed layer.

16. The method according to claim 15, further comprising a step of forming a fifth insulation sub-layer for partially covering the fourth insulation sub-layer and covering the second lead-out layer.

17. The method according to claim 15, further comprising a step of partially etching the insulating layer to form a hole penetrating through the insulating layer and filling the hole with a magnetic material.

* * * * *